United States Patent
Stegerer et al.

(10) Patent No.: US 9,153,369 B2
(45) Date of Patent: Oct. 6, 2015

(54) BIAS FIELD GENERATOR INCLUDING A BODY HAVING TWO BODY PARTS AND HOLDING A PACKAGED MAGNETIC SENSOR

(75) Inventors: Franz Stegerer, Regensburg (DE); Klaus Elian, Alteglofsheim (DE); Michael Weber, Mainburg (DE)

(73) Assignee: Infineon Technologies AG, Neubiberg (DE)

( * ) Notice: Subject to any disclaimer, the term of this patent is extended or adjusted under 35 U.S.C. 154(b) by 117 days.

(21) Appl. No.: 13/453,199

(22) Filed: Apr. 23, 2012

(65) Prior Publication Data

US 2013/0278246 A1 Oct. 24, 2013

(51) Int. Cl.
*G01B 7/30* (2006.01)
*H01F 7/02* (2006.01)
*G01R 33/09* (2006.01)
*G01R 33/00* (2006.01)

(52) U.S. Cl.
CPC .......... *H01F 7/0294* (2013.01); *G01R 33/0011* (2013.01); *G01R 33/0017* (2013.01); *G01R 33/09* (2013.01); *Y10T 29/4902* (2015.01)

(58) Field of Classification Search
USPC ............. 324/173–174, 207.2, 207.21, 207.25
See application file for complete search history.

(56) References Cited

U.S. PATENT DOCUMENTS

| | | | |
|---|---|---|---|
| 4,970,463 A | 11/1990 | Wolf et al. | |
| 5,508,611 A * | 4/1996 | Schroeder et al. | 324/252 |
| 6,107,793 A | 8/2000 | Yokotani et al. | |
| 6,818,478 B1 | 11/2004 | Wolf | |
| 7,112,955 B2 | 9/2006 | Buchhold | |
| 7,906,959 B2 * | 3/2011 | Frachon et al. | 324/207.25 |
| 8,058,870 B2 | 11/2011 | Sterling | |
| 2003/0155909 A1 * | 8/2003 | Steinruecken et al. | 324/207.2 |
| 2007/0001664 A1 | 1/2007 | Steinbrink et al. | |
| 2007/0063693 A1 | 3/2007 | Modest | |
| 2009/0243595 A1 * | 10/2009 | Theuss et al. | 324/207.11 |
| 2009/0322325 A1 | 12/2009 | Ausserlechner | |
| 2010/0295140 A1 | 11/2010 | Theuss et al. | |
| 2010/0327858 A1 | 12/2010 | Simek et al. | |
| 2011/0068779 A1 | 3/2011 | Werth et al. | |
| 2011/0267040 A1 * | 11/2011 | Frachon | 324/207.2 |
| 2012/0038352 A1 | 2/2012 | Elian et al. | |
| 2014/0167742 A1 * | 6/2014 | Moore et al. | 324/207.2 |

FOREIGN PATENT DOCUMENTS

| | | | |
|---|---|---|---|
| DE | 102011111094 A1 * | 3/2012 | |
| JP | 2000298134 A | 10/2000 | |
| JP | 2005283477 A | 10/2005 | |
| JP | 2012079424 A * | 4/2012 | |

* cited by examiner

*Primary Examiner* — Jay Patidar
(74) *Attorney, Agent, or Firm* — Slater & Matsil, L.L.P.

(57) ABSTRACT

A device is disclosed. In one embodiment the device comprises a bias field generator configured to provide a magnetic bias field for a magnetic sensor, the bias field generator including a body comprising magnetic or magnetizable material, a packaged magnetic sensor accommodating the magnetic sensor and a recess disposed in the body, wherein the packaged magnetic sensor is arranged in the recess, and wherein the body includes two separate body parts, each body part include a part of the recess, and each body part is configured to hold in place the packaged magnetic sensor.

12 Claims, 10 Drawing Sheets

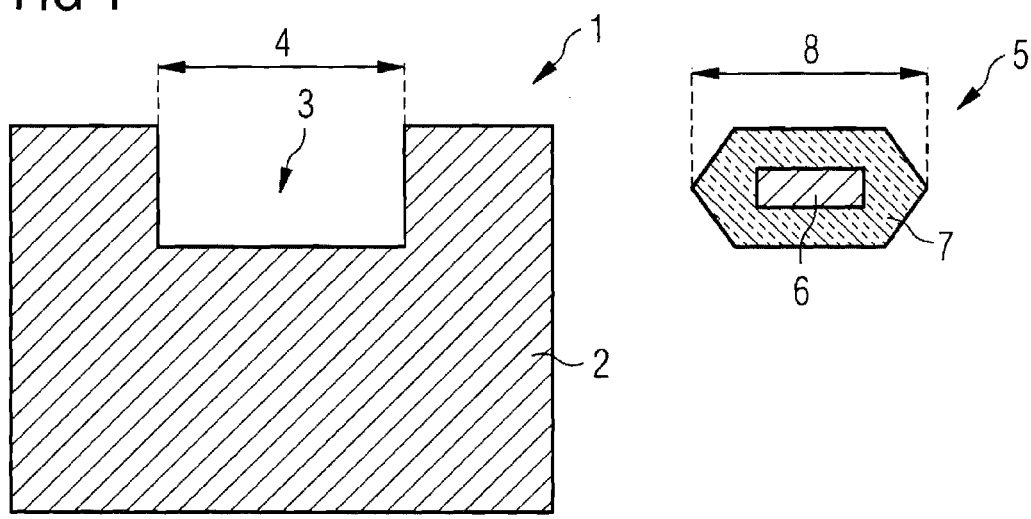
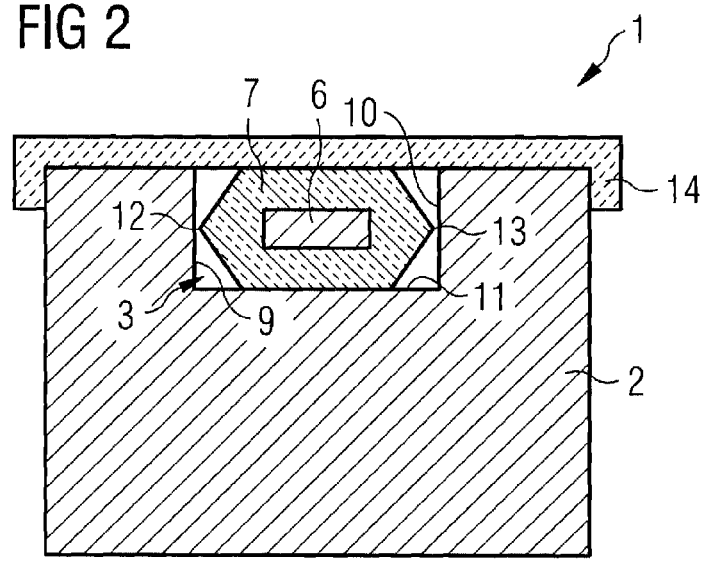

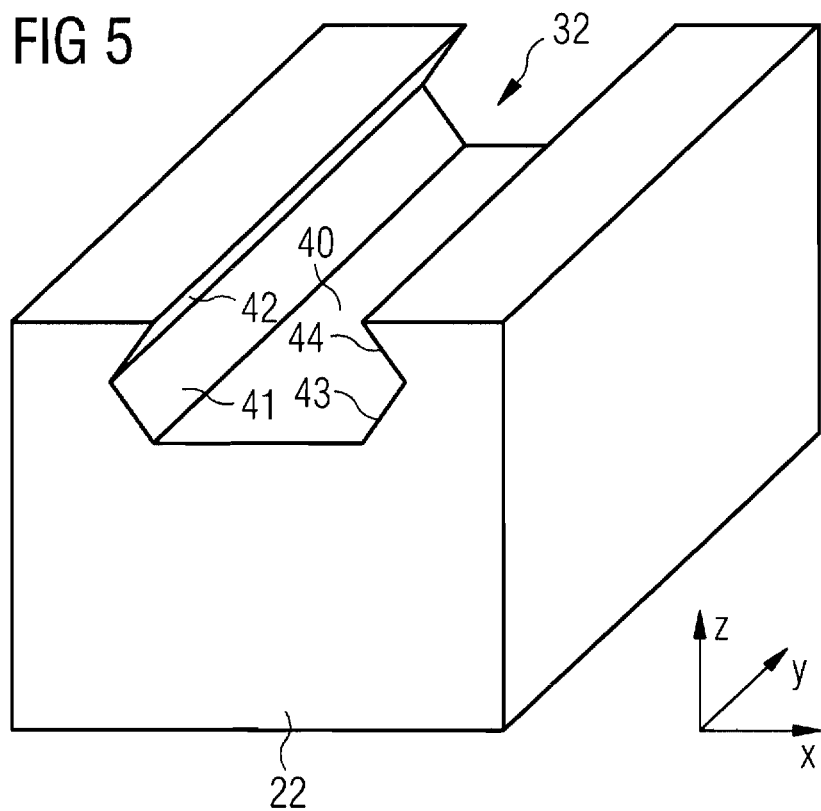
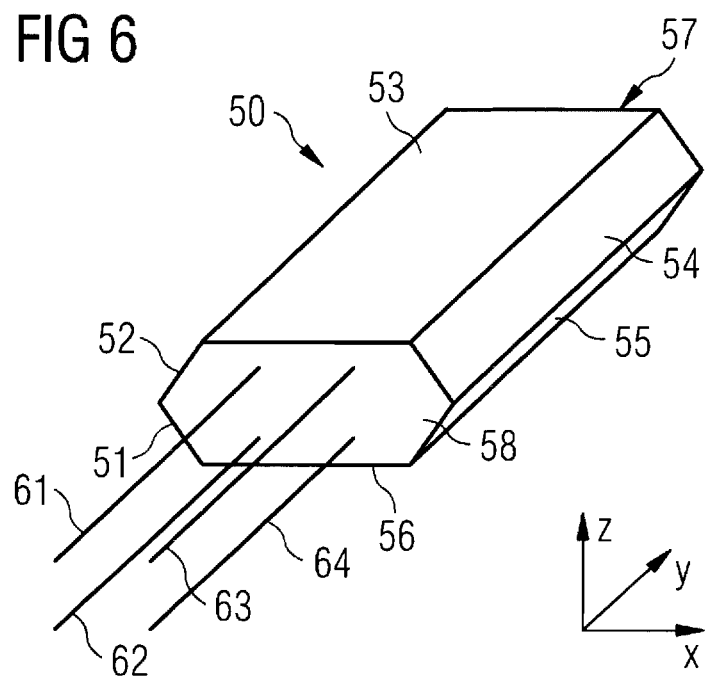

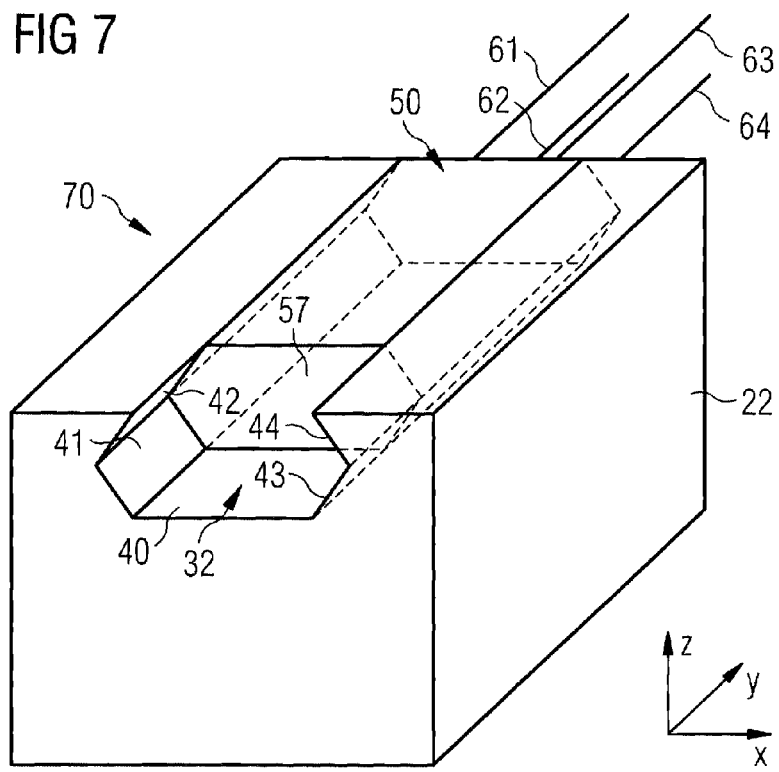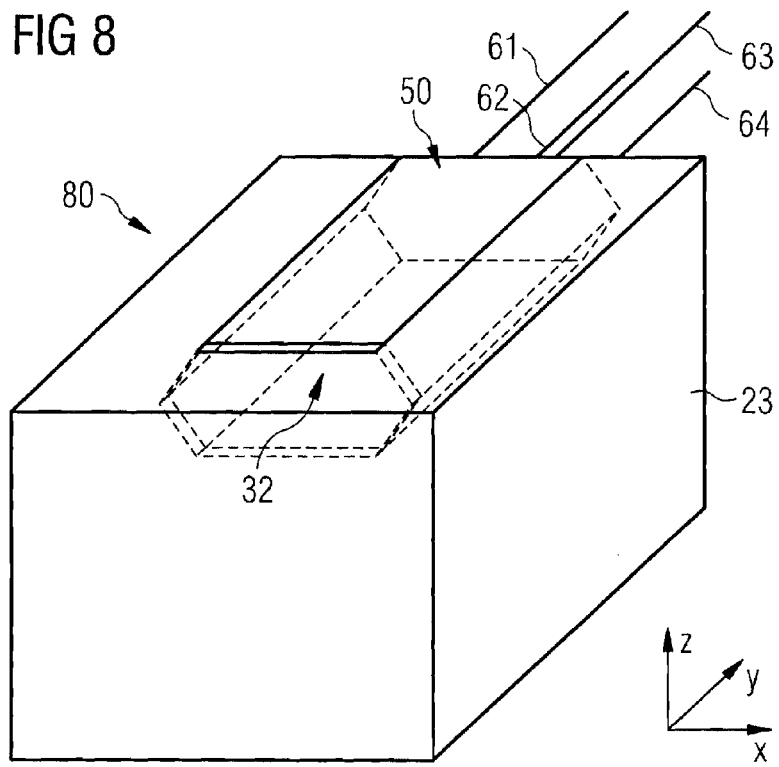

BIAS FIELD GENERATOR INCLUDING A BODY HAVING TWO BODY PARTS AND HOLDING A PACKAGED MAGNETIC SENSOR

TECHNICAL FIELD

The invention generally relates to bias field generators. In particular, the invention relates to a back bias magnet for a magnetic sensor.

BACKGROUND

Magnetic sensors are capable of detecting magnetic fields or changes of magnetic fields. Magnetoresistive effects used in magnetoresistive sensors include but are not limited to GMR (Giant Magnetoresistance), AMR (Anisotropic Magnetoresistance), TMR (Magneto Tunnel Effect), CMR (Colossal Magnetoresistance). Another type of magnetic sensors is based on the Hall effect. Magnetic sensors are used, for example, to detect the position of moving or rotating objects, the speed or rotational speed of rotating objects, etc. They may be used in automotive applications.

In some applications such as, for example, for the detection of a rotational speed of an object, a bias magnetic field is applied to the magnetic sensor in order to avoid saturation. Typical examples include, for example, a back bias magnet arrangement. In the back bias magnet arrangement, the magnetic sensor is provided between the object to be sensed and the bias magnet.

SUMMARY OF THE INVENTION

In an embodiment a recess is formed in a body comprising magnetic or magnetizable material. The body is part of a magnetic bias field generator. The recess is adapted to a package of a magnetic sensor. The magnetic sensor can be held in the recess so that a back bias magnet arrangement is easily provided.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a cross-sectional view of an embodiment of a bias field generator together with a cross-sectional view of a packaged magnetic sensor;

FIG. 2 schematically illustrates a cross-sectional view of the embodiment according to FIG. 1 with a packaged magnetic sensor inserted in the recess;

FIG. 5 schematically illustrates an embodiment of a bias field generator in a perspective view;

FIG. 6 schematically illustrates a packaged magnetic sensor in a perspective view;

FIG. 7 schematically illustrates an embodiment of a bias field generator in a perspective view with a packaged magnetic sensor inserted in the recess;

FIG. 8 schematically illustrates an embodiment of a bias field generator in a perspective view with a packaged magnetic sensor inserted in the recess;

DETAILED DESCRIPTION OF ILLUSTRATIVE EMBODIMENTS

Figure 3:
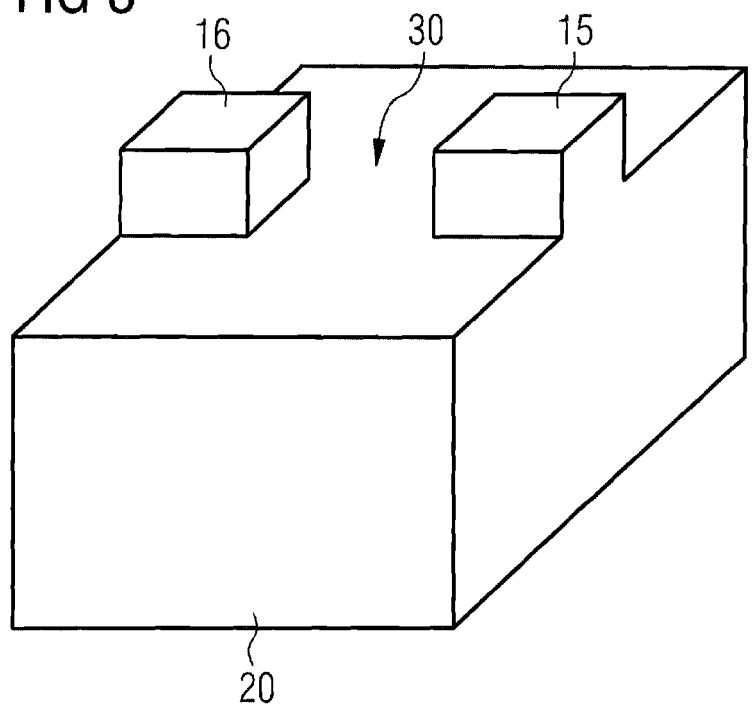
FIG. 3 schematically illustrates an embodiment of a bias field generator in a perspective view.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 schematically illustrates a cross-sectional view of a device 1 which may be, for example, a movement detector or a proximity detector. FIG. 1 further illustrates schematically a cross-sectional view of a packaged magnetic sensor 5.

Device 1 comprises a bias field generator 2. Bias field generator 2 provides a magnetic bias field for a magnetic sensor. In the embodiment shown, bias field generator 2 is formed by a body comprising magnetic or magnetizable material.

The magnetic material may comprise permanent magnetic material such as hard magnetic material. Hard magnetic materials may be considered ferromagnetic and have a high coercivity of greater than 2,000 Oersteds. For example, a neodymium magnet comprising the alloy NdFeB made from neodymium, iron and boron may have a coercivity between approximately 10,000-12,000 Oersteds. The hard magnetic material may include, for example, one or more of the metals iron, cobalt, nickel or compounds and alloys which possibly include the above-mentioned metals as components. The magnetizable material may comprise soft magnetic material. Soft magnetic materials are considered ferromagnetic and may have a low coercivity of less than 1,000 Oersteds. For example, cobalt has a coercivity of approximately 2 Oersteds. The soft magnetic material may comprise, for example, nickel, iron, iron-nickel, iron-silicon, iron-silicon-boron or iron-cobalt. Alternatively, the materials may be other materials with soft magnetic properties.

The body 2 constitutes a bias magnet for providing the magnetic bias field for a sensor. In some embodiments the body is a composite body including multiple parts formed of hard and/or soft magnetic materials.

In the body 2, a recess 3 is formed. Recess 3 is adapted to the packaged sensor 5 so as to provide a holder for the packaged sensor. In the cross-section shown in FIG. 1 the recess 3 may have a width 4 which corresponds to a width 8 of packaged magnetic sensor 5.

Packaged magnetic sensor 5 may comprise one or several magnetic sensors 6 and a package 7 encapsulating magnetic sensors 6. The magnetic sensor(s) 6 may use one of the magnetoresistive effects GMR (Giant Magnetoresistance), AMR (Anisotropic Magnetoresistance), TMR (Tunnel Magnetoresistance), CMR (Colossal Magnetoresistance). The magnetic sensor(s) 6 may also use the Hall effect. Whatever effect the magnetic sensor(s) 6 may use, it is adapted to sense a magnetic field.

The magnetic sensor(s) 6 may comprise a semiconductor chip having at least one magnetoresistive or Hall sensor element provided thereon. The magnetic sensor(s) 6 may have an integrated circuit included. The magnetoresistive sensing element may be a GMR, TMR, CMR, AMR element or any other form of magnetoresistive sensor elements. The magnetoresistive sensor may have two sensing elements provided in a gradiometer arrangement. The package 7 may include a plurality of semiconductor chips. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Semiconductor chips in which such functional elements are embedded generally contain electronic circuits which serve for driving the functional elements or further processing signals generated by the functional elements. The semiconductor chips need not be manufactured from specific semiconductor material, for example Si, SiC, SiGe, GaAs, and, furthermore, may contain inorganic and/or organic materials that are not semiconductors, such as, for example, discrete passives, insulators, plastics or metals.

The magnetic sensors or semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

Package 7 may cover the magnetic sensor 6 and the semiconductor chip or chips with an encapsulation material, which may be electrically insulating. The encapsulation material may be any appropriate laminate (prepreg) or thermoplastic or thermosetting material. The encapsulation material may, for example, be a mold material which may be based on an epoxy material and may contain a filling material consisting of small particles of glass ($SiO_2$) or other electrically insulating mineral filler materials like $Al_2O_3$ or organic filler materials. Various techniques may be employed to cover the semiconductor chips with the mold material, for example, compression molding, injection molding, powder molding, liquid molding and transfer molding.

The magnetic sensors and/or the semiconductor chips include external contact elements or external contact pads, which may be of any shape and size. The external contact elements may be accessible from outside the packaged magnetic sensor 5 and may thus allow electrical contact to be made with the semiconductor chips from outside the packaged magnetic sensor. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conductive organic material. Solder material, such as solder balls or solder bumps, may be deposited on the external contact elements. The contact elements are not shown in FIG. 1. By way of example, in this and the other embodiments described herein, width 4 may be approximately identical to width 8.

In the embodiment shown in FIG. 1 the cross-section of package 7 is a hexagon. The longest distance between two opposite corners is given by a width 8. Width 8 is an outer dimension of the package 7. The width 4 of recess 3 of magnet 2 is adapted to width 8 such that packaged magnetic sensor 5 is held in recess 3.

FIG. 2 schematically illustrates a cross-sectional view of device 1 with packaged magnetic sensor 5 inserted in recess 3. Package 7 may abut at contact points 12 and 13 of two opposite side walls 9 and 10 which form a border of recess 3. Furthermore, package 7 may abut bottom 11 of recess 3. The inserted housed magnetic sensor 5 is held by body 2. By inserting the housed magnetic sensor 5 a sensor module is formed comprising a back-biased magnetic sensor, i.e. a magnetic sensor which is arranged in a magnetic bias field such that the magnetic sensor will not be saturated, for example. The sensor module may be arranged in a sensor module housing.

Recess 3 may be adapted to packaged magnetic sensor 5 in a form-fit manner and no further holder may be required after inserting the packaged sensor. In this case, the holding may be provided by clamping forces which may, e.g., be caused by the resilience of the material of the body 2 and/or the material of the housing 7. In an embodiment, the holding may include gluing the packaged sensor 5 to body 2. In an embodiment, the holding may include adding a mechanical holder 14 which may extend over at least a part of body 2 and package 7. Mechanical holder 14 may comprise elastic or clamping parts allowing an easy attachment.

FIG. 3 shows in a perspective view an embodiment of a body 20 comprising magnetic or magnetizable material, the body 20 providing a magnetic bias field. A recess 30 which is adapted to an outer dimension of a packaged magnetic sensor or housing 7 is formed by two opposing protrusions 15 and 16. The protrusions 15, 16 may hold a packaged magnetic sensor in a form-fit manner.

Figure 4:
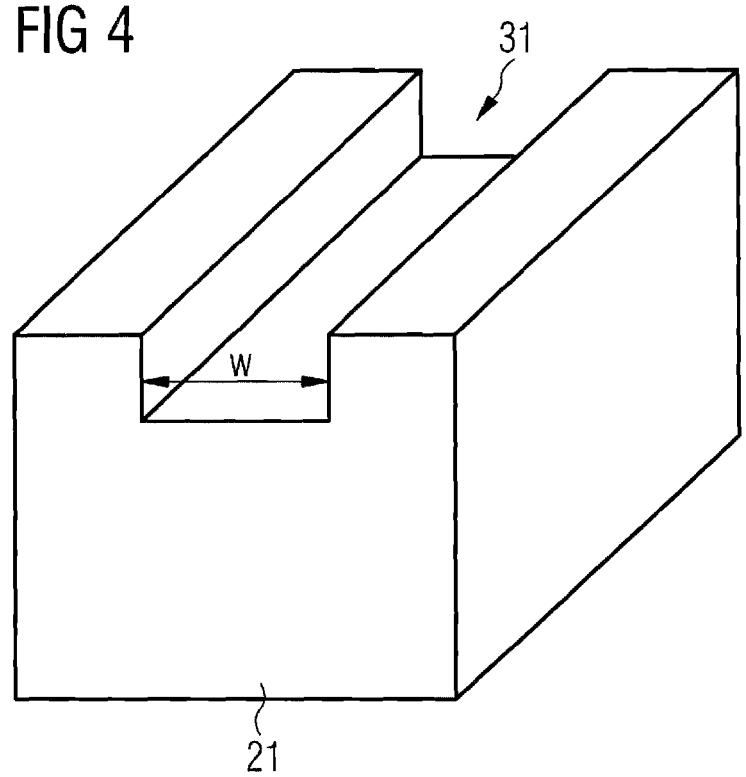
FIG. 4 schematically illustrates an embodiment of a bias field generator in a perspective view.

FIG. 4 is a perspective view of an embodiment of a body 21 comprising magnetic or magnetizable material, the body 21 providing a magnetic bias field. In other words, body 21 constitutes a bias magnet. A recess 31 which is adapted to an outer dimension of a packaged magnetic sensor is formed by a notch 31. A packaged magnetic sensor may be inserted in the notch 31. A width w of the notch 31 is adapted to the package of the magnetic sensor so as to hold the package in place. Conventionally, a separate holder had to be provided for assembly of a sensor module with a back-biased magnetic sensor. With a recess, for example, a notch provided in a body which generates the bias field, it is possible to dispense with a separate holder.

FIG. 5 is a perspective view of an embodiment of a body 22 comprising magnetic or magnetizable material, the body 22 providing a magnetic bias field. Body 22 is shaped to provide a recess or notch 32 which is adapted or matched to a housed or packaged magnetic sensor 50. Packaged magnetic sensor 50 is shown in a perspective view in FIG. 6. Notch 32 has a bottom surface 40. A first surface of body 22 delineating or defining notch 32 is formed by a first area 41 and a second area 42. First area 41 is adjacent to bottom surface 40 and second area 42 is adjacent to first area 41. First area 41 and second area 42 form together an essentially convex or overhanging border to notch 32. A second surface of body 22 delineating or defining notch 32 is formed by a third area 43 and a fourth area 44. Third area 43 is adjacent to bottom surface 40 and fourth area 44 is adjacent to third area 43. Third area 43 and fourth area 44 form together an essentially convex border to notch 32. In an orthogonal coordinate system as indicated in FIG. 5, the first and second surfaces delineate or define the notch 32 in the x-direction. Notch 32 extends along the y-direction. In general, packaged magnetic sensor 50 may have more than n (outer) surfaces intersecting the x-z plane, with n being any integer greater than 2.

Packaged magnetic sensor 50 comprises a first package surface 51 and a second package surface 52. First area 41 and second area 42 of body 22 are adapted or matched to first and second package surfaces 51 and 52. The two surfaces 51 and 52 respectively the two areas 41 and 42 enclose the same angle with each other and they have approximately the same width. Packaged magnetic sensor 50 further comprises a third package surface 53, a fourth package surface 54, a fifth package surface 55 and a sixth package surface 56. Third area 43 and fourth area 44 of body 22 are adapted or matched to fourth and fifth package surface 54 and 55. The two surfaces 54 and 55 respectively the two areas 43 and 44 enclose the same angle with each other and they have approximately the same width. They are adapted or matched to each other. Bottom surface 40 of body 22 is adapted to the sixth package surface 56 of packaged magnetic sensor 50, i.e. they have approximately the same width. In other words, a cross-section of notch 32 in the x-z-plane is the same as a cross-section of packaged magnetic sensor 50 in the x-z-plane. Packaged magnetic sensor 50 further comprises a seventh surface 57 and an eighth surface 58. External contact elements 61, 62, 63 and 64 which provide electrical contact to the encapsulated magnetic sensor or/and to encapsulated semiconductor chips pass through the eighth package surface 58. In the embodiment, four external contact elements 61, 62, 63 and 64 are shown. However, any number of external contact elements, depending on the kind of magnetic sensor encapsulated, is possible.

FIG. 7 shows a sensor module 70 comprising the packaged magnetic sensor 50 as shown in FIG. 6 and the body 22 as shown in FIG. 5. Packaged magnetic sensor 50 is inserted, e.g. pushed or pressed, into the notch 32 along the y-direction. In the x-direction, the sensor 50 is held between the first surface 41, 42 and the second surface 43, 44. In the z-direction, the sensor is held by the bottom surface 40 and by the second area 42 and the fourth area 44, due to the convex shape of the first and second surfaces. Only in the y-direction a further holder may be needed. External contact elements 61, 62, 63 and 64 stick out of body 22 and may be contacted by conventional methods.

Although body 22 is represented essentially as a rectangular parallelepiped this is not to be understood as limiting. Any outer form of body 22 suitable for providing the desired magnetic bias field is also possible.

FIG. 8 shows a further embodiment of a sensor module. A body 23 comprising magnetic or magnetizable material provides a magnetic bias field. The body 23 is a bias magnet or a bias field generator. Body 23 comprises a notch 32 which is formed as described with reference to FIG. 6. Body 23 differs from body 22 at least in that the notch 32 does not extend from one end of body 23 to the other but is closed at one end in the y-direction. Packaged magnetic sensor 50 which is inserted in notch 32 may abut body 23 with the seventh package surface 57 which is opposite the eighth package surface 58 through which the external contact elements 61, 62, 63 and 64 may pass. Sensor 50 may abut body 23 with six package surfaces 51, 52, 54, 55, 56 and 57 and is held more firmly.

In the following, further embodiments will be described with reference to FIGS. 9 to 18 which all show cross-sections of different bodies comprising magnetic or magnetizable material for providing a magnetic bias field. All bodies provide a holder for a packaged magnetic sensor wherein a cross-section of the package to which the bodies are adapted is, by way of example, essentially octagonal (or, more generally, polygonal having more than n surfaces intersecting the x-z plane, with n being any integer greater than 6). Thus the package of FIGS. 9 to 18 differs from the package shown in FIG. 6 by the number of (outer) package surfaces. The invention is not limited to the package forms shown in the described embodiments. The body shape, i.e., the shape of the bias magnet may be adapted to any form of package. It suffices to evaluate the outer dimensions of a housed magnetic sensor and to manufacture the bias magnet shaped in a way to provide a holder to the packaged or housed magnetic sensor.

Figure 9:
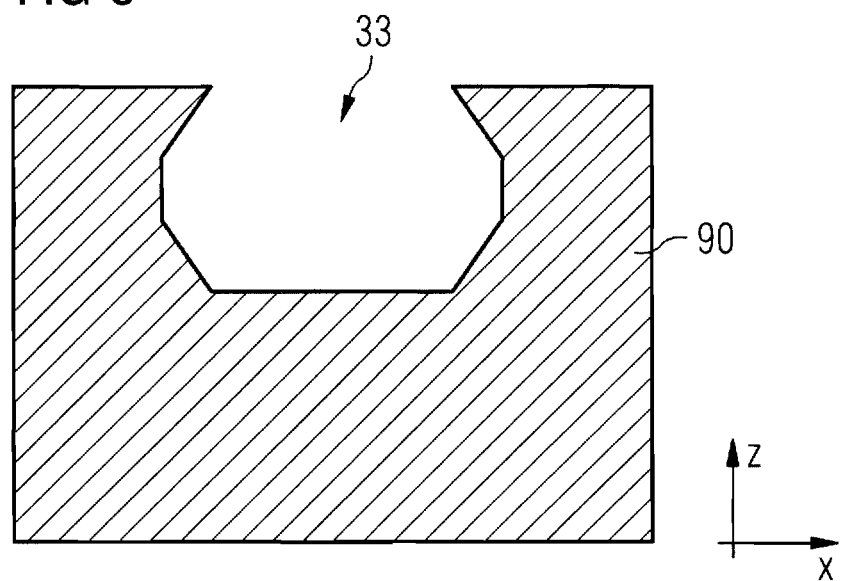
FIG. 9 schematically illustrates a cross-sectional view of an embodiment of a bias field generator.

FIG. 9 shows a cross-section of a body 90. Body 90 comprises a notch 33. Notch 33 may pass through the whole body 90 in the same way as shown in FIG. 5. Notch 33 may, e.g., be closed at one end as shown in FIG. 8.

Figure 10:
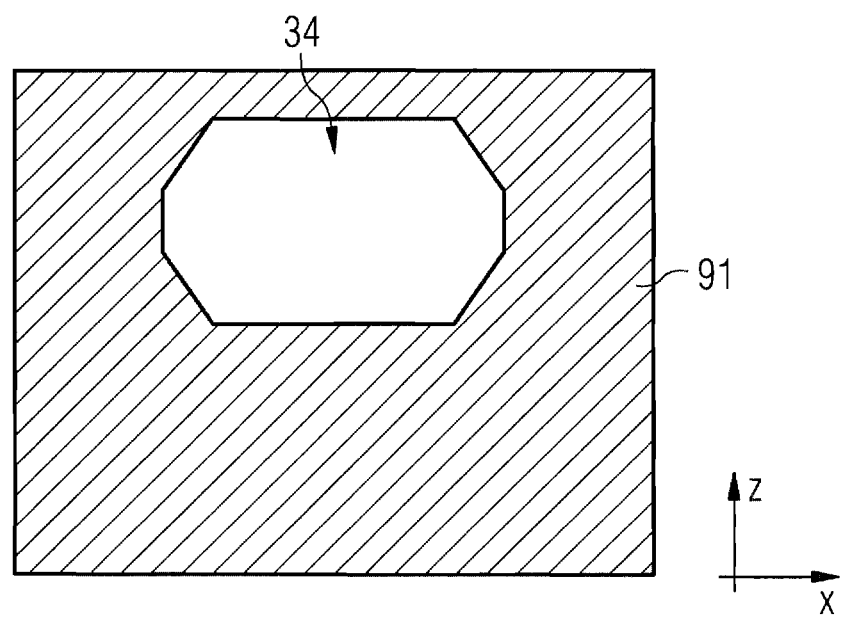
FIG. 10 schematically illustrates a cross-sectional view of an embodiment of a bias field generator.

FIG. 10 shows a cross-section of a body 91. Body 91 comprises a notch 34. Notch 34 may pass through the whole body 91 in the same way as shown in FIG. 5. Notch 34 may e.g. be closed at one end as shown in FIG. 8. Notch 34 is closed in the z-direction to two sides. Notch 34 provides a cavity closed at least in z- and in x-direction to both sides and in y-direction open to one or to two sides.

Figure 11:
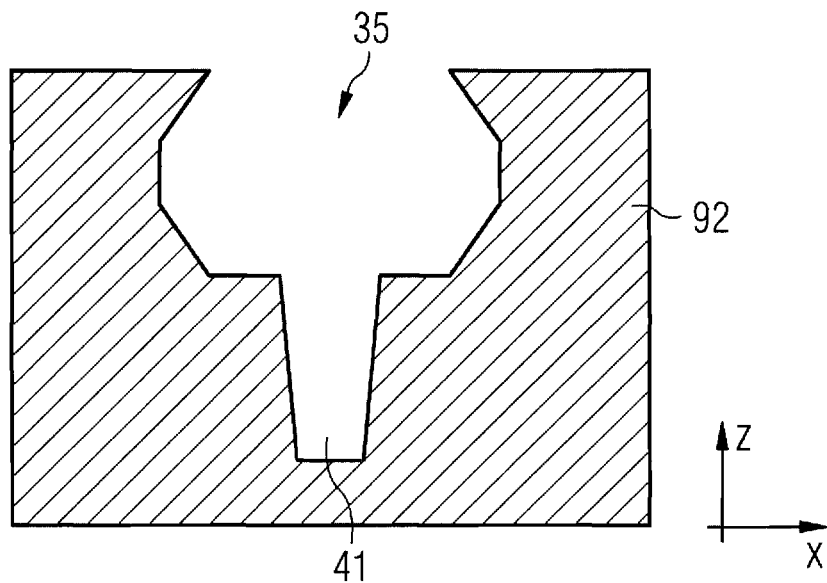
FIG. 11 schematically illustrates a cross-sectional view of an embodiment of a bias field generator including a cavity.

FIG. 11 shows a further embodiment in a cross-sectional view. A body 92 comprises a notch 35 providing a holder for a packaged magnetic sensor as shown in the previous embodiments. Body 92 further comprises a cavity 41. The cavity 41 is configured to shape the magnetic field generated by body 92. Cavity 41 opens into notch 35.

It can be seen from the cross-section in FIG. 11 that the cavity 41 has a bottom extending in a first approximation parallel to a bottom of notch 35 and thus roughly parallel to a package surface of an inserted packaged magnetic sensor. A lateral width of cavity 41 in the direction of the x-axis increases when moving in a vertical direction, i.e., along the z-axis, away from the cavity bottom towards notch 35. A lateral width of cavity 41 in the direction of the y-axis, which is perpendicular to the drawing plane in FIG. 11, may increase in the same way as the lateral width in the direction of the x-axis when moving in a vertical direction, i.e., along the z-axis, away from the cavity bottom towards notch 35. Cavity 41 has then the form of a frustrum. Cavity 41 may also be formed as a notch extending along the y-axis, parallel to notch 35. Cavity 41 formed as a notch may be closed at both ends in the direction of the y-axis, being shorter than the packaged magnetic sensor, longer than the packaged magnetic sensor or having the same length than the packaged magnetic sensor.

Providing the cavity 41 in body 92 allows an independent two-dimensional shaping of the magnetic field generated by the body 92. Thus, a magnetic bias field is provided, for example, with reduced or zero lateral field components in the x- and y-directions. The cavity 41 provides a shaping of the magnetic bias field such that at the location of the inserted packaged magnetic sensor the lateral components of the magnetic field at least in the x-direction and in the y-direction are zero or reduced to almost zero. In particular, the x-components and y-components can be shaped independently from each other by the shape of the cavity 41. The holder provided by the notch 35 may be adapted to the cavity 41 in a way to hold the packaged magnetic sensor in a position relative to the magnetic bias field which is best for the functioning of the sensor. For example, the packaged magnetic sensor may abut the body 92 in y-direction similar to the embodiment shown in FIG. 8.

Figure 12:
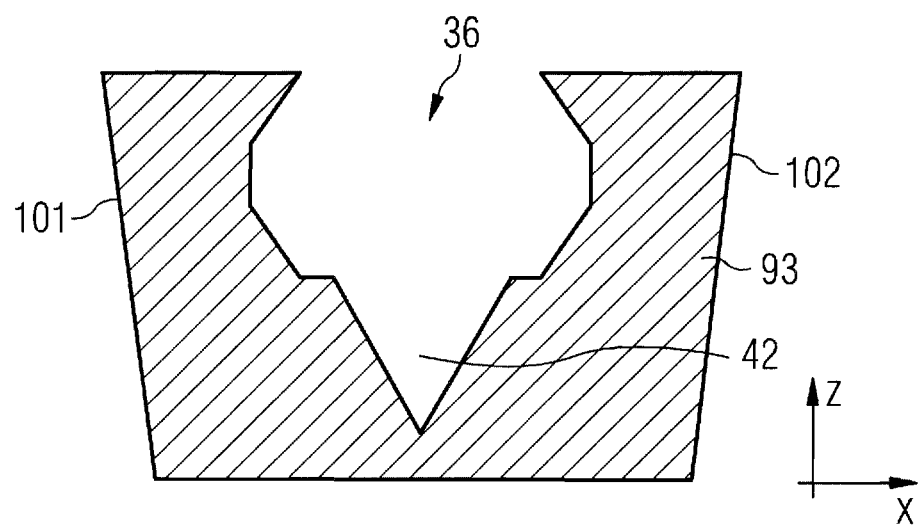
FIG. 12 schematically illustrates a cross-sectional view of an embodiment of a bias field generator including a cavity.

A further embodiment is shown in FIG. 12. A cross-sectional view of a body 93 shows a notch 36 which is adapted in form to a packaged magnetic sensor insertable into notch 36. The body 93 further comprises a cavity 42 which is adapted to shape the magnetic bias field. Cavity 42 differs from cavity 41 in the previous embodiment in that there is no flat bottom. Cavity 42 may have the form of a pyramid or extend along a y-axis similar to cavity 41. Body 93 is represented with two outer surfaces 101 and 102 which are not parallel to each other. The form of the body generating the magnetic bias field as shown in all embodiments is only exemplary.

The described forms of cavities 41 and 42 are not to be understood in a limiting sense. They all have the capability to shape the magnetic bias field for the magnetic sensor which is to be inserted in the holder formed by the adapted notch.

Figure 13:
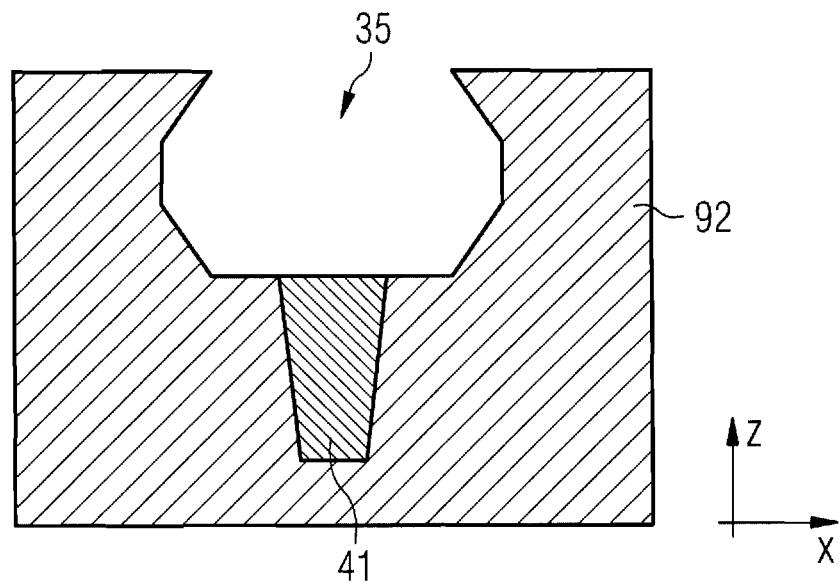
FIG. 13 schematically illustrates a cross-sectional view of an embodiment of a bias field generator including a flux controller.

FIG. 13 illustrates a further embodiment. Body 92, notch 35 and cavity 41 may correspond to those explained with reference to FIG. 11. However, cavity 41 may not represent an opening filled with ambient air but cavity 41 may be filled with a flux controller material. The flux controller material may be a soft magnetic material. Body 92 according to this embodiment may be a composite body comprising a hard magnetic material and in the cavity 41 a soft magnetic material. The form of cavity 41 and the properties of the soft magnetic material define together a shaping influence on the magnetic bias field. A composite body may also comprise hard and soft magnetic material in another arrangements shaping the magnetic bias field.

Figure 14:
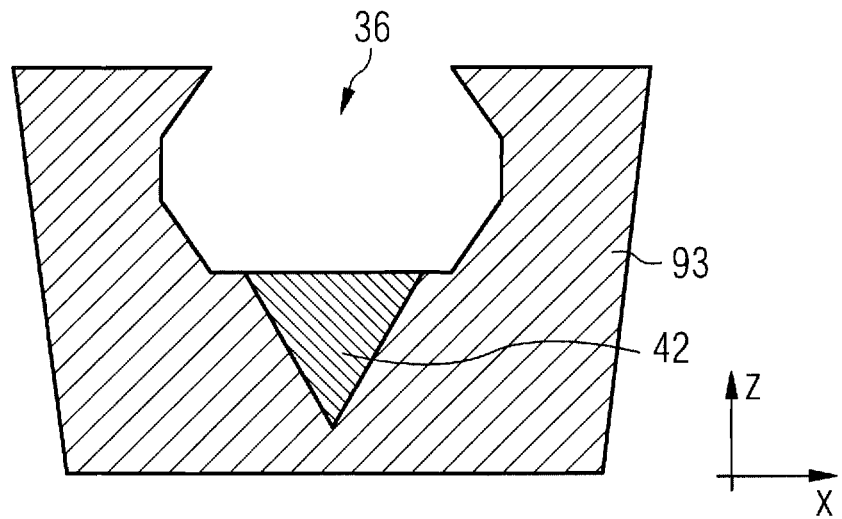
FIG. 14 schematically illustrates a cross-sectional view of an embodiment of a bias field generator including a flux controller.

FIG. 14 illustrates a further embodiment. Body 93, notch 36 and cavity 42 may correspond to those explained with reference to FIG. 12. As for the embodiment shown in FIG. 13 cavity 42 may be filled with a flux controller material. The flux controller material may be a soft magnetic material. Body 93 according to this embodiment may be a composite body comprising a hard magnetic material and in the cavity 41 a soft magnetic material. The form of cavity 41 and the properties of the soft magnetic material define together a shaping influence on the magnetic bias field.

Figure 15:
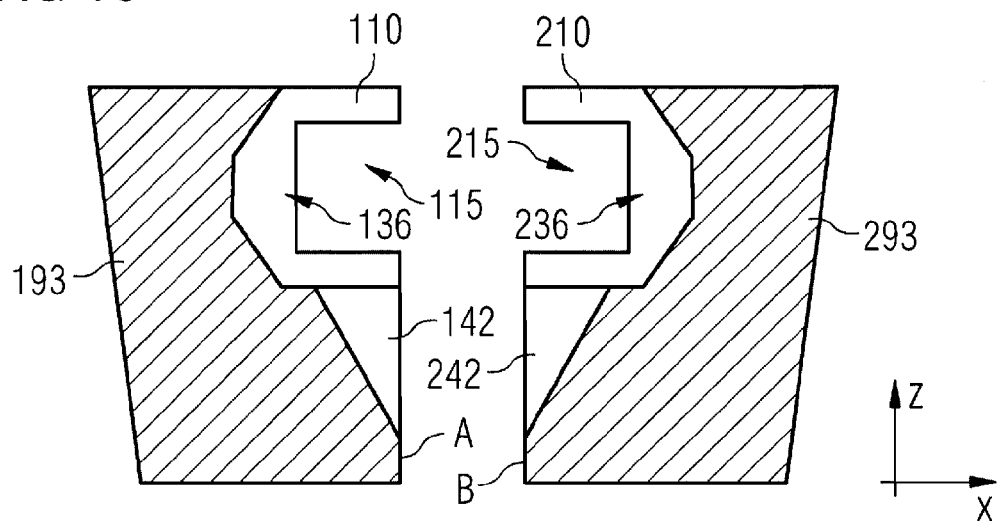
FIG. 15 schematically illustrates a cross-sectional view of an embodiment of a bias field generator including two magnet parts.

FIG. 15 shows an embodiment comprising two bias magnet parts 193 and 293 with assembling surfaces A and B. When parts 193 and 293 are put together, i.e., when assembling surface A lies against assembling surface B a bias magnet resembling to body 93 shown in FIG. 12 is formed. Bias magnet part 193 comprises a cavity 142 and bias magnet part 293 comprises a cavity 242 which form together a cavity when the two parts are assembled. Cavities 142 and 242 may be filled with a soft magnetic material as explained for the embodiment shown in FIG. 14. Bias magnet part 193 comprises a notch 136 which is partly closed by a protruding part 110 of part 193 in a y-direction. Bias magnet part 293 comprises a notch 236 which is partly closed by a protruding part 210 of part 293 in a y-direction. Notches 136 and 236 form together a notch providing a holder for a packaged magnetic sensor when the two parts 193 and 293 are assembled. Notches 136 and 236 may be open to the other side in y-direction or they may be completely closed. Assembling surfaces A and B may be formed to provide guidance for assembling and for holding.

It may be an advantage of a body assembled of two body parts that the notch which provides a holder for a packaged magnetic sensor may be closed in all directions with the exception of letting a pass through or passage for the electrical contacts of the sensor. Such a pass through is provided in the embodiment shown in FIG. 15 by openings 115 and 215 surrounded by the protruding parts 110 and 210. The packaged magnetic sensor may be inserted before assembling the two parts. Notches 136 and 236 may be adapted to the package of the packaged magnetic sensor in such a way that the packaged sensor is held in place in a form-fit manner. While embodiments with two magnet parts are shown, embodiments with more than two magnet parts are also possible.

Figure 16:
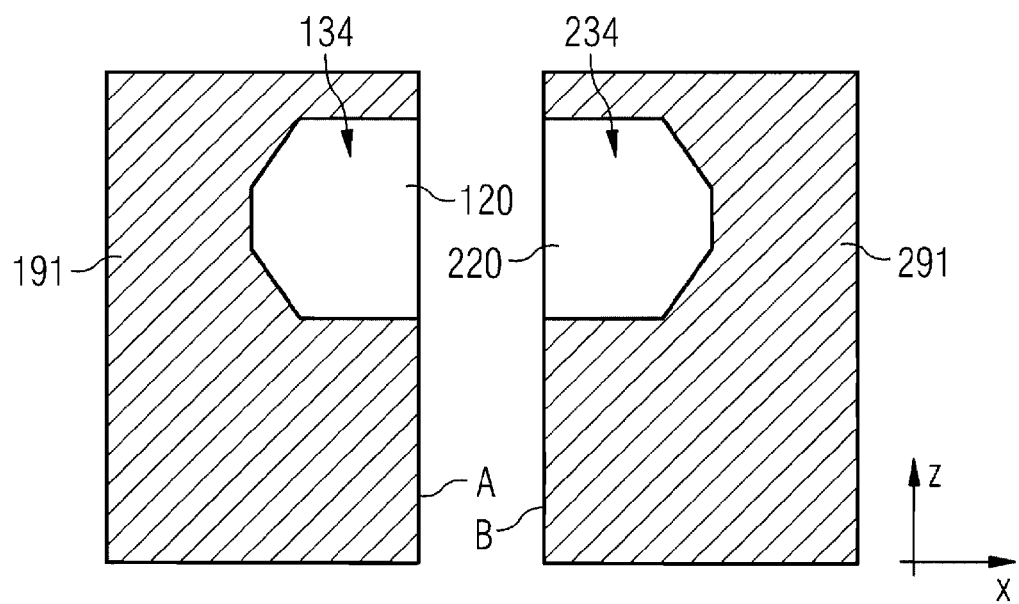
FIG. 16 schematically illustrates a cross-sectional view of an embodiment of a bias field generator including two magnet parts.

FIG. 16 shows a further embodiment with two magnet parts 191 and 291 with assembling surfaces A and B. When parts 191 and 291 are put together, i.e., when assembling surface A lies against assembling surface B, a bias magnet resembling to body 91 shown in FIG. 11 is formed. Bias magnet part 191 comprises a notch 134 which may be closed by a part 120 of magnet part 191 in the y-direction. Bias magnet part 291 comprises a notch 234 which may be closed by a part 220 of magnet part 291 in the y-direction. Notches 134 and 234 form together a notch providing a holder for a packaged magnetic sensor when the two parts 191 and 291 are assembled. As explained above, magnetic parts 191 and 192 may provide an opening for the electrical contacts of the packaged magnetic sensor to be held by the bias magnet.

Figure 17:
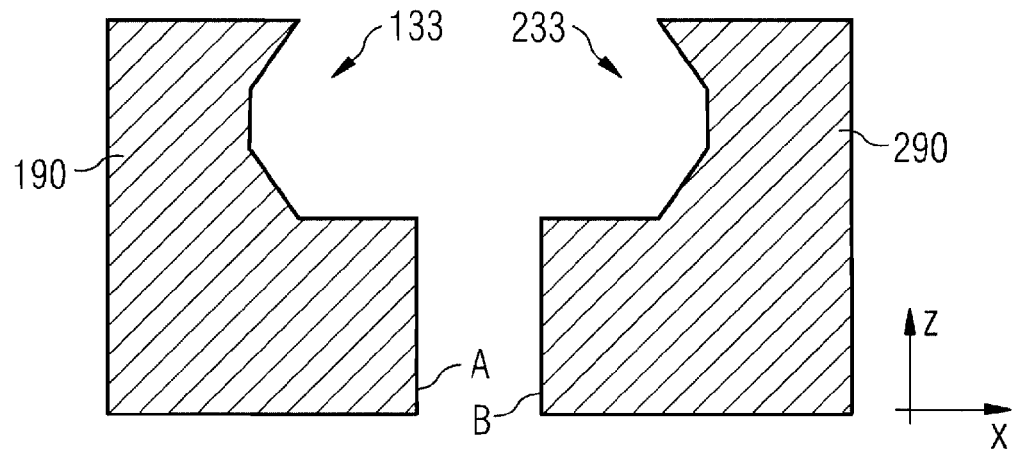
FIG. 17 schematically illustrates a cross-sectional view of an embodiment of a bias field generator including two magnet parts.
Figure 18:
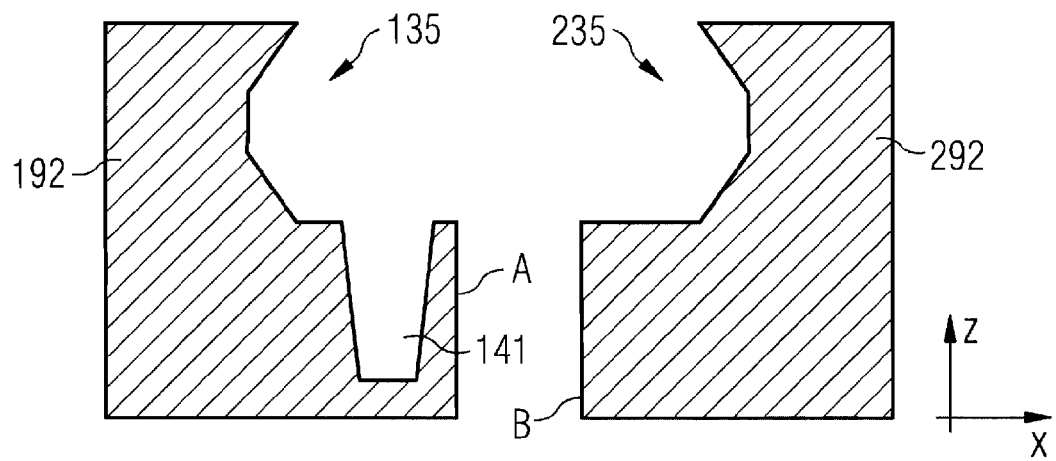
FIG. 18 schematically illustrates a cross-sectional view of an embodiment of a bias field generator including two magnet parts.

FIGS. 17 and 18 show further embodiments comprising two magnet parts which are assembled by putting an assembling surface A of the first magnet part against an assembling surface B of the other magnet part. The embodiment of FIG. 17 corresponds to the embodiment shown in FIG. 9, while the embodiment of FIG. 18 corresponds to the embodiment shown in FIG. 11 (with the reference numbers modified to correspond). In the embodiment according to FIG. 18 only the magnet part 192 comprises a bias field shaping cavity 141. The cavity 141 is not divided in two as is the cavity 142, 242 in FIG. 15. In either embodiment the cavity 142, 242 or the cavity 141 may be filled by a soft magnetic material.

In an embodiment with two magnet parts, holding of the packaged magnetic sensor to the bias magnet may be achieved by fixing the two magnet parts together. The two magnet parts may be fixed together by inserting the assembled parts into a bias magnet or a sensor module housing. Holding may further be achieved by any mechanical holding or by gluing. Other methods of holding are also possible.

Figure 19:
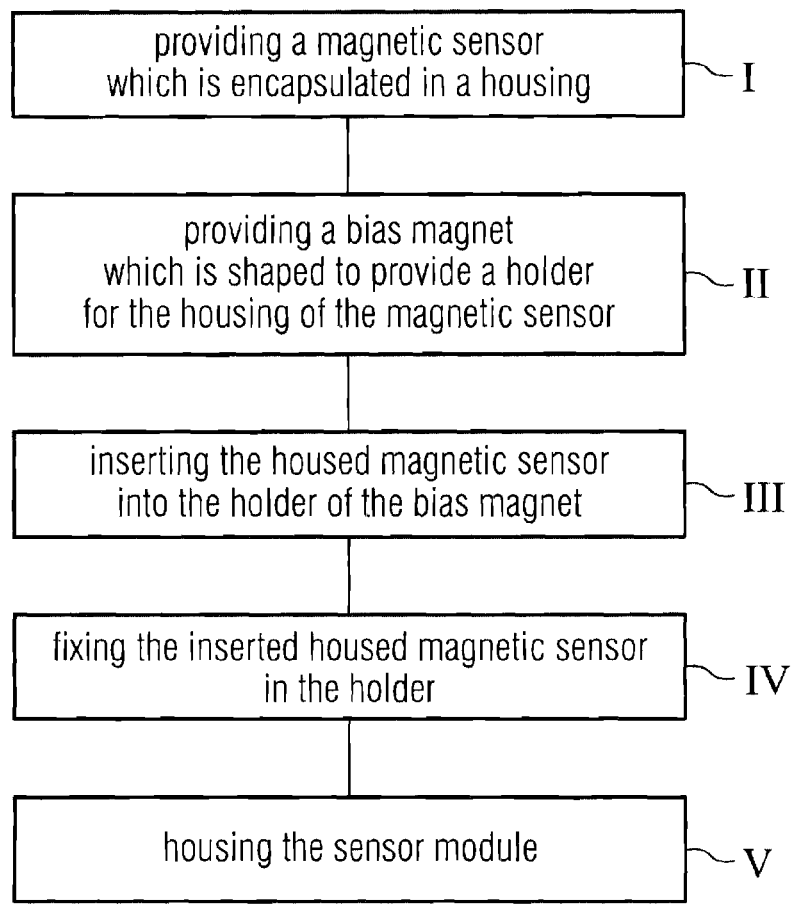
FIG. 19 schematically illustrates a method as an exemplary embodiment.

FIG. 19 is a flowchart illustrating a method of manufacturing a sensor module according to an embodiment. In step I a housed magnetic sensor is provided. The sensor may be chosen to be best suited for the aimed application.

In step II a bias magnet is provided. The bias magnet is shaped to provide a holder for the housing of the sensor. The dimensions of the housed magnetic sensor may be measured or dimensions as given in data sheets may be used to evaluate a suitable shape of the bias magnet for holding the packaged magnetic sensor. The bias magnet may additionally be formed to shape the magnetic bias field at least at the position where the magnetic sensor will be held in place by the shaped bias magnet.

In step III the packaged magnetic sensor is inserted into the holder provided by the bias magnet. If the bias magnet is a two-part bias magnet inserting the magnetic sensor may include assembling the two magnet parts.

In step IV the inserted housed magnetic sensor is fixed in the holder. As the sensor is already held in place by the bias magnet, no additional requirements to the holding mechanism may be needed. Fixing the sensor in the holder may be achieved merely by fixing two magnet parts together.

In optional step V the sensor module, i.e., the bias magnet with the inserted sensor is housed in a sensor module housing. Step V may be combined with step IV when fixing the housed magnetic sensor in the bias magnet is achieved by inserting the sensor module in a sensor module housing.

Figure 20:
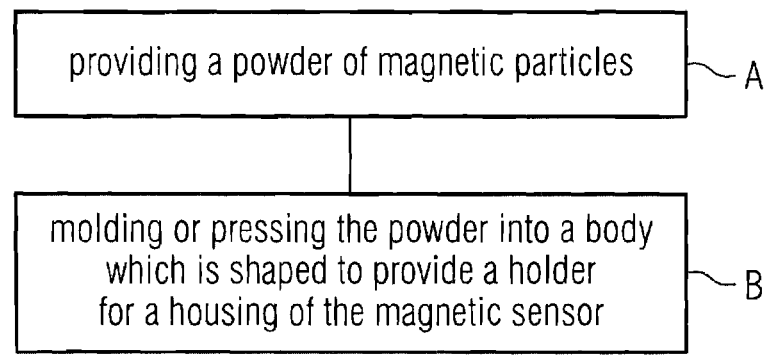
FIG. 20 schematically illustrates a method as an exemplary embodiment.

FIG. 20 is a flowchart illustrating a method of manufacturing a sensor module according to an embodiment. For manufacturing a bias field generator which is adapted to generate a magnetic bias field for a magnetic sensor in step A, a powder of magnetic particles is provided. In a next step B, the powder is molded or pressed into a body which is shaped to provide a holder for a housing of a magnetic sensor.

Methods for forming a magnet of a desired shape out of the powder or granulate of magnetic particles include but are not limited to, e.g., sintering, casting and injection-molding. Sintering comprises heating the powder to a temperature below the melting point and pressing it into form. Casting comprises heating the powder to a temperature above the melting point and pouring the liquid into a mold. Injection-molding comprises using a resin or a composite of a various kinds of resins or plastic materials with the powder of magnetic particles and injecting the mix into a mold. The preferable method depends on the shape of the bias magnet to be manufactured, the magnetic material used and whether a composite body or a homogenous body is desired. For example, in an embodiment a body of a first magnetic material may be formed comprising a cavity and the cavity may be filled with a second magnetizable material afterwards. In another embodiment the body may be manufactured by depositing different layers on top of each other to obtain a layered structure.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. This application is intended to cover any adaptations or variations of the specific embodiments discussed herein. Therefore, it is intended that this invention be limited only by the claims and the equivalents.

What is claimed is:

1. A device comprising a bias field generator configured to provide a magnetic bias field for a magnetic sensor, the bias field generator comprising:
   a body comprising magnetic or magnetizable material;
   a packaged magnetic sensor accommodating the magnetic sensor; and
   a recess disposed in the body, wherein the packaged magnetic sensor is arranged in the recess, and
   wherein the body comprises two separate body parts, each body part comprises a notch, and each notch being configured to a package of the packaged magnetic sensor such that the packaged magnetic sensor is held in a form-fit manner in all directions in the recess.

2. The device of claim 1, wherein the body comprises a first surface and a second surface each forming a part of the recess in the body and delineating the recess in a first direction, and wherein the first surface and the second surface have an essentially convex shape.

3. The device of claim 1, wherein the recess is open to a side in a second direction of the body, and wherein the second direction is essentially perpendicular to a first direction of the body.

4. The device of claim 1, further comprising a cavity disposed in the body, wherein the cavity opens into the recess, and wherein the cavity is configured to shape the magnetic bias field in the recess.

5. The device of claim 1, wherein each body part comprises an assembling surface, the assembling surfaces lying against each other when the body is assembled, wherein each body part comprises a cavity which opens into the recess and into the respective assembling surface, and wherein the two cavities together are configured to shape the magnetic bias field in the recess.

6. The device of claim 1, wherein only one out of the two body parts comprises a cavity which opens into the recess, and wherein the cavity is configured to shape the magnetic bias field in the recess.

7. A device comprising:
a bias magnet configured to provide a magnetic bias field for a magnetic sensor, wherein the bias magnet is shaped to provide a holder for a package which accommodates the magnetic sensor, wherein the bias magnet comprises at least two separate magnet parts, each magnet part comprising a notch which is in a form-fit manner to the package, and wherein the holder is formed by assembling the at least two magnet parts together, the holder holding the package in all directions in a recess.

8. The device of claim 7, wherein the bias magnet is further shaped for shaping the magnetic bias field inside the holder.

9. A sensor module comprising:
a magnetic sensor configured to sense a magnetic field;
a housing in which the magnetic sensor is encapsulated; and
a bias magnet configured to provide a magnetic bias field for the magnetic sensor,
wherein the bias magnet is shaped forming a holder for the housing of the magnetic sensor, the housing being disposed within the holder,
wherein the holder comprises two separate holder parts and each holder part is configured to hold in place the housing of the magnetic sensor, and
wherein the holder holds the housing in a form-fit manner in all directions.

10. The sensor module of claim 9, wherein the bias magnet is further shaped forming a cavity configured to shape the magnetic bias field in the holder.

11. The sensor module of claim 10, wherein the cavity comprises a flux controller.

12. The sensor module of claim 9, further comprising a further holding mechanism to fix the magnetic sensor in the holder.

* * * * *